(12) United States Patent
Takase et al.

(10) Patent No.: US 10,580,808 B2
(45) Date of Patent: Mar. 3, 2020

(54) PHOTODETECTION DEVICE AND IMAGING DEVICE

(71) Applicant: Panasonic Intellectual Property Management Co., Ltd., Osaka (JP)

(72) Inventors: Masayuki Takase, Osaka (JP); Sanshiro Shishido, Osaka (JP)

(73) Assignee: Panasonic Intellectual Property Management Co. Ltd., Osaka (JP)

( * ) Notice: Subject to any disclaimer, the term of this patent is extended or adjusted under 35 U.S.C. 154(b) by 0 days.

(21) Appl. No.: 16/006,478

(22) Filed: Jun. 12, 2018

(65) Prior Publication Data

US 2019/0006402 A1 Jan. 3, 2019

(30) Foreign Application Priority Data

Jun. 29, 2017 (JP) .................................. 2017-127567

(51) Int. Cl.
*H01L 27/148* (2006.01)
*H01L 27/146* (2006.01)
*H04N 5/378* (2011.01)

(52) U.S. Cl.
CPC .. *H01L 27/14605* (2013.01); *H01L 27/14612* (2013.01); *H04N 5/378* (2013.01)

(58) Field of Classification Search
CPC ......... H01L 27/14605; H01L 27/14612; H01L 27/1446; H01L 27/14614
See application file for complete search history.

(56) References Cited

U.S. PATENT DOCUMENTS

| 2007/0158713 | A1* | 7/2007 | Ohkawa ............ H01L 27/14603 257/292 |
| 2008/0030607 | A1 | 2/2008 | Ikeda et al. |
| 2012/0200842 | A1 | 8/2012 | Kamiyama et al. |
| 2017/0006241 | A1 | 1/2017 | Shishido et al. |

FOREIGN PATENT DOCUMENTS

| JP | 2007-201160 | 8/2007 |
| JP | 2011-082358 | 4/2011 |
| JP | 2017-017583 | 1/2017 |

* cited by examiner

*Primary Examiner* — Stephen M Bradley
*Assistant Examiner* — Wasiul Haider
(74) *Attorney, Agent, or Firm* — McDermott Will & Emery LLP

(57) ABSTRACT

A photodetection device includes: a photoelectric converter generating charge; a first diffusion region having a first end connected to the photoelectric converter and a second end and extending in a first direction from the first end toward the second end; a second diffusion region having a third end connected to a first side surface, of the first diffusion region, which is along the first direction and a fourth end and extending in a second direction from the third end toward the fourth end; a first charge accumulator connected to the fourth end; a first gate electrode covering at least part of the first diffusion region; and a second gate electrode covering at least part of the second diffusion region. The second gate electrode covers a first portion of the first diffusion region without the first gate electrode intervention. The first portion is adjacent to the second diffusion region.

12 Claims, 13 Drawing Sheets

PHOTODETECTION DEVICE AND IMAGING DEVICE

BACKGROUND

1. Technical Field

The present disclosure relates to a photodetection device that detects light.

2. Description of the Related Art

Photodetection devices that detect a timing at which light is incident are known (see Japanese Unexamined Patent Application Publication No. 2017-17583, for example). According to these photodetection devices, a timing at which light is incident can be detected at an accuracy of a certain degree.

SUMMARY

A further improvement in temporal resolution is desired in the detection of a timing at which light is incident.

In one general aspect, the techniques disclosed here feature a photodetection device provided with: a photoelectric converter that generates charge; a first diffusion region that has a first end and a second end, the first end being connected to the photoelectric converter, the first diffusion region extending in a first direction from the first end toward the second end; a second diffusion region that has a third end and a fourth end, the third end being connected to a first side surface of the first diffusion region, the first side surface being along the first direction, the second diffusion region extending in a second direction from the third end toward the fourth end; a first charge accumulator that is connected to the fourth end of the second diffusion region; a first gate electrode that covers at least a part of the first diffusion region; and a second gate electrode that covers at least a part of the second diffusion region. The second gate electrode covers a first portion of the first diffusion region without the first gate electrode intervention, the first portion being adjacent to the second diffusion region.

General or specific aspects may be realized by means of an element, a device, a module, a system, an integrated circuit, or a method. Furthermore, general or specific aspects may be realized by means of an arbitrary combination of an element, a device, a module, a system, an integrated circuit, and a method.

Additional benefits and advantages of the disclosed embodiments will be apparent from the specification and figures. The benefits and/or advantages may be individually provided by the various embodiments or features disclosed in the specification and figures, and need not all be provided in order to obtain one or more of the same.

DETAILED DESCRIPTION (Underlying Knowledge Forming Basis of Aspect of the Present Disclosure)

Here, first, a photodetection device according to a reference example will be described.

Figure 15:
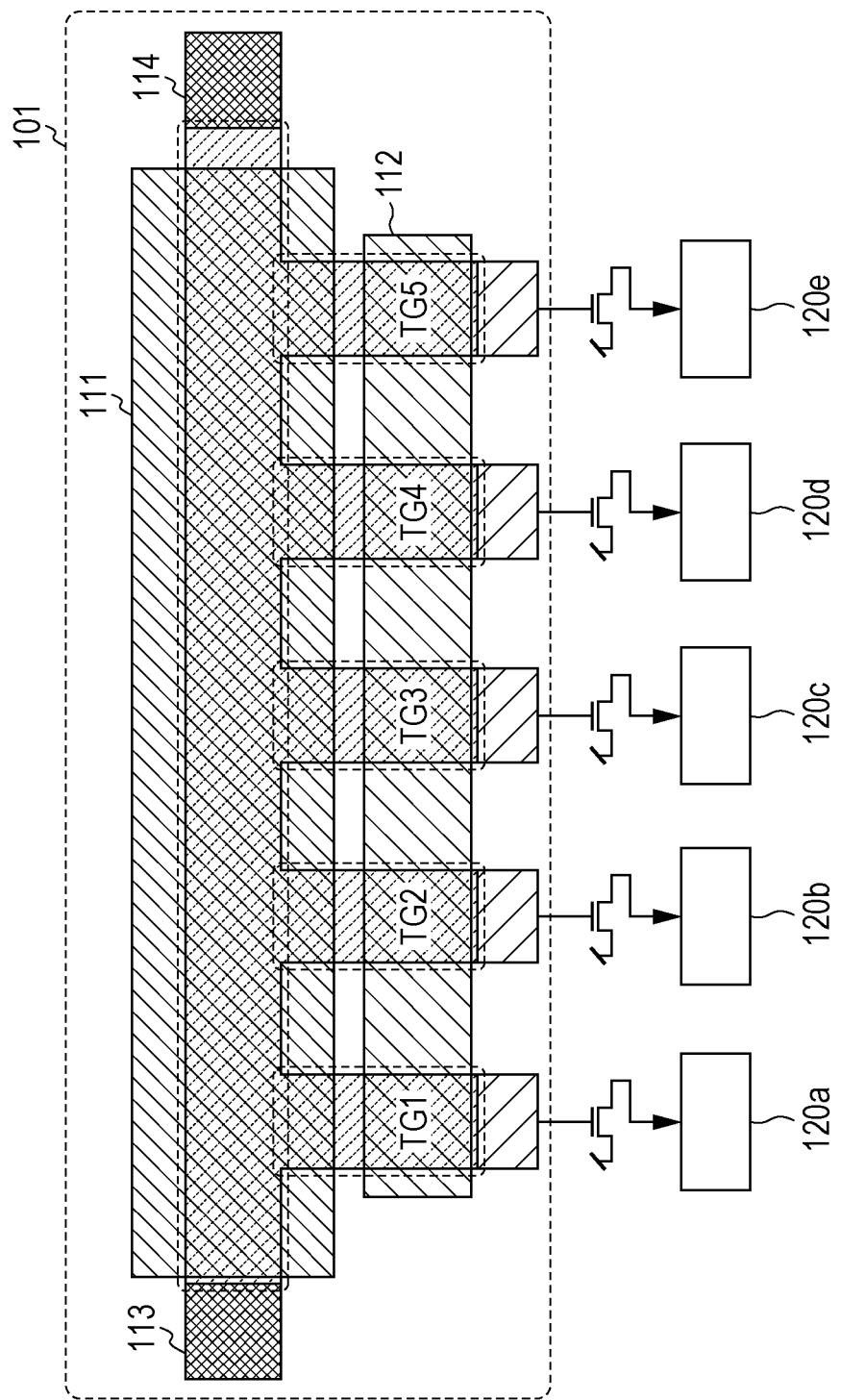
FIG. 15 is a configuration diagram of a photodetection device of a reference example.

FIG. 15 is a configuration diagram of the photodetection device (in other words, an imaging element 101) of the reference example.

In the photodetection device of the reference example, first, a channel (also referred to as a transfer channel) is formed below a first gate electrode 111 by controlling the potential of the first gate electrode 111. Then, a charge group that has been generated by light being incident on a light receiving unit 113 is made to travel from the light receiving unit 113 side to a charge sweeping unit 114 side within that transfer channel. Then, while the charge group is traveling, at least a portion of that traveling charge group is guided to a plurality of FDs respectively connected to read circuits (120a to 120e), by controlling the potential of a second gate electrode 112. Then, by specifying the position of an FD from which at least a portion of the traveling charge group has been read, the time at which that charge group was generated, in other words, the timing at which light was incident, is detected.

In relation to the photodetection device of the reference example, the inventors repeatedly carried out investigations in order to further improve temporal resolution in the detection of a timing at which light is incident.

In the photodetection device of the reference example, the potential in the transfer channel is made to slant from the light receiving unit 113 side to the charge sweeping unit 114 side in order to cause the charge group to travel from the light receiving unit 113 side to the charge sweeping unit 114 side.

Therefore, the difference in potential between the source/drain in a TG1 to a TG5, which are transistors for guiding traveling charge to the FDs connected to read circuits, declines sequentially from the TG1 to TG5. Therefore, the current driving capability of the transistors declines sequentially from the TG1 to TG5. As a result, an amount of charge is sometimes not read with sufficient accuracy from a charge group that has traveled to a position that is far from the light receiving unit (in the vicinity of the TG3, TG4, and TG5 in FIG. 15, for example).

The inventors discovered that temporal resolution in the detection of a timing at which light is incident can be improved by suppressing the effects caused by this kind of phenomenon.

As a result of repeatedly carrying out such investigations, the inventors conceived of the photodetection device and the imaging device described hereinafter.

A photodetection device according to one aspect of the present disclosure is provided with: a photoelectric converter that generates charge; a first diffusion region that has a first end and a second end, the first end being connected to the photoelectric converter, the first diffusion region extending in a first direction from the first end toward the second end; a second diffusion region that has a third end and a fourth end, the third end being connected to a first side surface of the first diffusion region, the first side surface being along the first direction, the second diffusion region extending in a second direction from the third end toward the fourth end; a first charge accumulator that is connected to the fourth end of the second diffusion region; a first gate electrode that covers at least a part of the first diffusion region; and a second gate electrode that covers at least a part of the second diffusion region. The second gate electrode covers a first portion of the first diffusion region without the first gate electrode intervention, the first portion being adjacent to the second diffusion region.

In the photodetection device of the aforementioned configuration, the second gate electrode is arranged overlaid above a diverging region (also referred to as a first portion) where the second diffusion region diverges from the first diffusion region. Therefore, a potential valley is formed in the portion where the second diffusion region diverges from the first diffusion region. It thereby becomes possible for charge of a charge group that is traveling through a transfer channel to be captured comparatively easily in this potential valley portion even if the position where the second diffusion region diverges from the first diffusion region is a position that is comparatively far from the photoelectric conversion unit (i.e., light receiving unit). It therefore becomes possible to read an amount of charge more accurately from a charge group that is traveling through a position that is comparatively far from the photoelectric conversion unit (i.e., light receiving unit).

Consequently, according to the photodetection device having the aforementioned configuration, it is possible to improve temporal resolution in the detection of a timing at which light is incident.

An imaging device according to one aspect of the present disclosure is provided with a pixel array in which a plurality of pixels configured from the aforementioned photodetection device are arranged in an array.

The plurality of pixels provided in the imaging device having the aforementioned configuration are configured from photodetection devices that can improve temporal resolution in the detection of a timing at which light is incident.

Consequently, according to the imaging device having the aforementioned configuration, it is possible to improve temporal resolution in the detection of a timing at which light is incident.

Hereinafter, specific examples of the photodetection device and the imaging device according to one aspect of the present disclosure will be described with reference to the drawings. The embodiments given here all represent specific examples of the present disclosure. Consequently, the numerical values, the shapes, the constituent elements, the arrangement and mode of connection of the constituent elements, the steps (processes), the order of the steps, and the like given in the following embodiments are examples and do not restrict the present disclosure. From among the constituent elements in the following embodiments, constituent elements that are not mentioned in the independent claims are constituent elements that may be optionally added. Furthermore, each drawing is a schematic view and is not necessarily depicted in an exact manner.

First Embodiment

Hereinafter, an imaging device according to the first embodiment will be described with reference to the drawings. This imaging device is provided with a pixel array in which a plurality of pixels configured from photodetection devices according to first embodiment are arranged in an array.

[1-1. Configuration]

Here, first, a photodetection according to first embodiment will be described.

Figure 1:
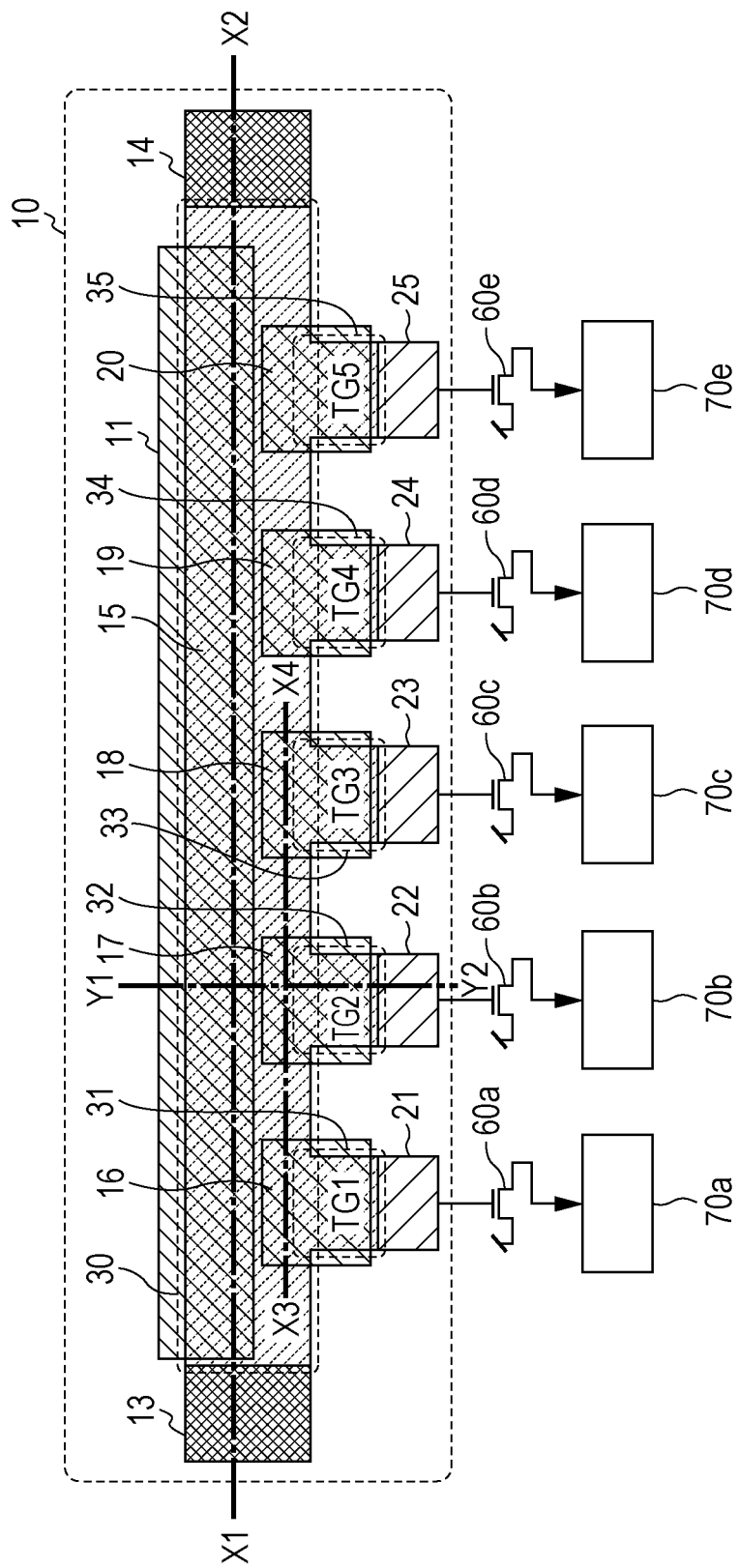
FIG. 1 is a plan view of a photodetection device according to a first embodiment.
Figure 2:
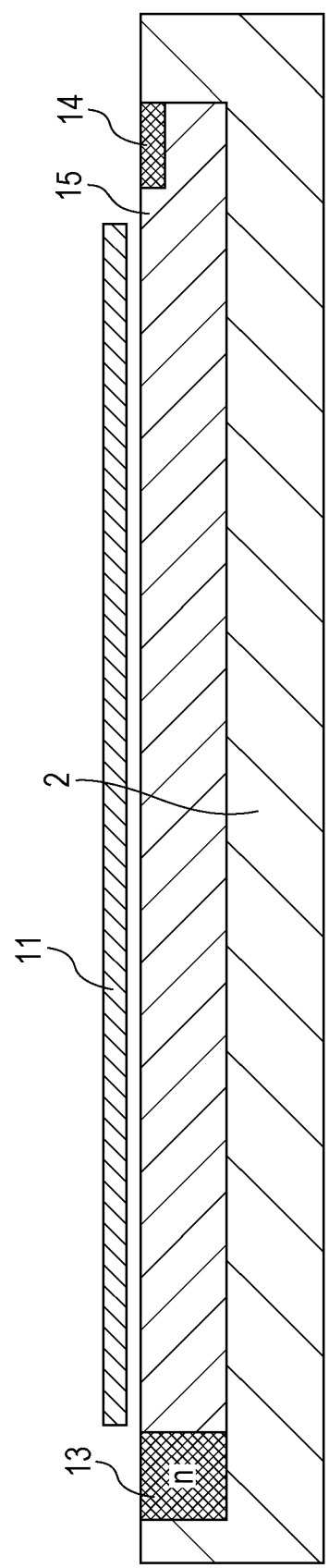
FIG. 2 is a cross-sectional view along line X1-X2 of the photodetection device according to the first embodiment.
Figure 3:
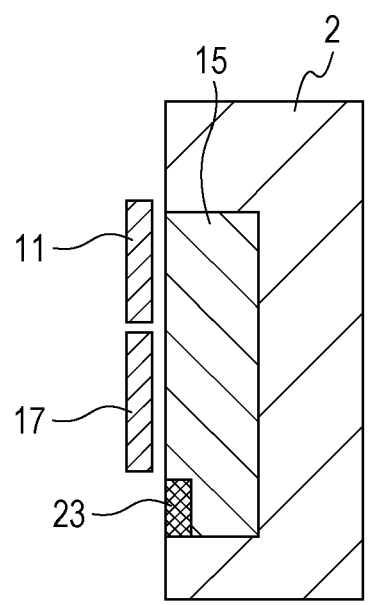
FIG. 3 is a cross-sectional view along line Y1-Y2 of the photodetection device according to the first embodiment.

FIG. 1 is a plan view of a photodetection device 10 according to the first embodiment. FIG. 2 is a cross-sectional view along line X1-X2 depicted in FIG. 1, of the photodetection device 10 according to the first embodiment. FIG. 3 is a cross-sectional view along line Y1-Y2 depicted in FIG. 1, of the photodetection device 10 according to the first embodiment.

As depicted in FIGS. 1, 2, and 3, the photodetection device 10 is configured including a first gate electrode 11, a second gate electrode 16, a third gate electrode 17, a fourth gate electrode 18, a fifth gate electrode 19, a sixth gate electrode 20, a photoelectric conversion unit 13, a charge sweeping unit 14, an injection region 15, a first charge accumulation unit 21, a second charge accumulation unit 22, a third charge accumulation unit 23, a fourth charge accumulation unit 24, and a fifth charge accumulation unit 25.

It should be noted that FIGS. 1, 2, and 3 are merely schematic drawings for illustration purposes, and the sizes of the parts in the drawings do not necessarily reflect the actual sizes. Likewise also in other drawings, the size of an element depicted in the drawings may not match the actual size of that element.

The photoelectric conversion unit 13 includes a photoelectric conversion element that is capable of receiving incident light and generating charge. Here, a photodiode is given as an example of the photoelectric conversion element.

As depicted in FIGS. 2 and 3, in this example, the photoelectric conversion unit 13, the charge sweeping unit 14, the injection region 15, the first charge accumulation unit 21, the second charge accumulation unit 22, the third charge accumulation unit 23, the fourth charge accumulation unit 24, and the fifth charge accumulation unit 25 are formed in a semiconductor substrate 2 such as a silicon (Si) substrate. The semiconductor substrate 2 is not restricted to a substrate in which the entirety thereof is a semiconductor, and may be an insulating substrate or the like in which a semiconductor layer is provided on the surface of a side on which a photosensitive region is formed. Hereinafter, a p-type silicon substrate is given as an example of the semiconductor substrate 2. In this example, the photoelectric conversion unit 13 is formed by forming an impurity region (here, an n-type region) in the p-type silicon substrate. Furthermore, the injection region 15 is formed by forming an impurity region (here, an n-type region) having a concentration that is equivalent to or higher than that of the photoelectric conversion unit 13 in the p-type silicon substrate. Also, the first charge accumulation unit 21, the second charge accumulation unit 22, the third charge accumulation unit 23, the fourth charge accumulation unit 24, and the fifth charge accumulation unit 25 are formed by forming impurity regions (here, n-type regions) having a concentration that is higher than that of the injection region 15 in the p-type silicon substrate.

As depicted in FIG. 1, the injection region 15 is configured from a long main section 30 (also referred to as a first diffusion region), a first finger section 31 (also referred to as a second diffusion region), a second finger section 32 (also referred to as a third diffusion region), a third finger section 33 (also referred to as a fourth diffusion region), a fourth finger section 34 (also referred to as a fifth diffusion region), and a fifth finger section 35 (also referred to as a sixth diffusion region). One end and the other end of the main section 30 are respectively connected to the photoelectric conversion unit 13 and the charge sweeping unit 14. The first finger section 31 diverges from the main section 30 and is connected to the first charge accumulation unit 21. The second finger section 32 diverges from the main section 30 and is connected to the second charge accumulation unit 22. The third finger section 33 diverges from the main section 30 and is connected to the third charge accumulation unit 23. The fourth finger section 34 diverges from the main section 30 and is connected to the fourth charge accumulation unit 24. The fifth finger section 35 diverges from the main section 30 and is connected to the fifth charge accumulation unit 25.

As depicted in FIG. 1, the fifth finger section 35 diverges from the main section 30 at a position that is further than the fourth finger section 34 from the photoelectric conversion unit 13. The fourth finger section 34 diverges from the main section 30 at a position that is further than the third finger section 33 from the photoelectric conversion unit 13. The third finger section 33 diverges from the main section 30 at a position that is further than the second finger section 32 from the photoelectric conversion unit 13. The second finger section 32 diverges from the main section 30 at a position that is further than the first finger section 31 from the photoelectric conversion unit 13.

As depicted in FIGS. 1 to 3, the first gate electrode 11 is arranged overlaid above a region (also referred to as a second region) of a portion of the main section 30. The second gate electrode 16 is arranged overlaid above a region (also referred to as a first region) that includes: a diverging region, of the main section 30, in which the first finger section 31 diverges from the main section 30; and the first finger section 31. The third gate electrode 17 is arranged overlaid above a region (also referred to as a third region) that includes: a diverging region, of the main section 30, in which the second finger section 32 diverges from the main section 30; and the second finger section 32. The fourth gate electrode 18 is arranged overlaid above a region (also referred to as a fourth region) that includes: a diverging region, of the main section 30, in which the third finger section 33 diverges from the main section 30; and the third finger section 33. The fifth gate electrode 19 is arranged overlaid above a region (also referred to as a fifth region) that includes: a diverging region, of the main section 30, in which the fourth finger section 34 diverges from the main section 30; and the fourth finger section 34. The sixth gate electrode 20 is arranged overlaid above a region (also referred to as a sixth region) that includes: a diverging region, of the main section 30, in which the fifth finger section 35 diverges from the main section 30; and the fifth finger section 35.

Here, a transistor that is formed by the second gate electrode 16 and the first region is referred to as a TG1. A transistor that is formed by the third gate electrode 17 and the third region is referred to as a TG2. A transistor that is formed by the fourth gate electrode 18 and the fourth region is referred to as a TG3. A transistor that is formed by the fifth gate electrode 19 and the fifth region is referred to as a TG4. A transistor that is formed by the sixth gate electrode 20 and the sixth region is referred to as a TG5.

In the injection region 15, a predetermined potential is applied to a gate electrode positioned thereabove (here, the first gate electrode 11, the second gate electrode 16, the third gate electrode 17, the fourth gate electrode 18, the fifth gate electrode 19, or the sixth gate electrode 20, for example), and an inversion layer is thereby formed on a surface portion thereof. This inversion layer functions as a charge transfer channel that transfers charge generated by the photoelectric conversion unit 13 to any of the charge sweeping unit 14, the first charge accumulation unit 21, the second charge accumulation unit 22, the third charge accumulation unit 23, the fourth charge accumulation unit 24, or the fifth charge accumulation unit 25.

Figure 4:
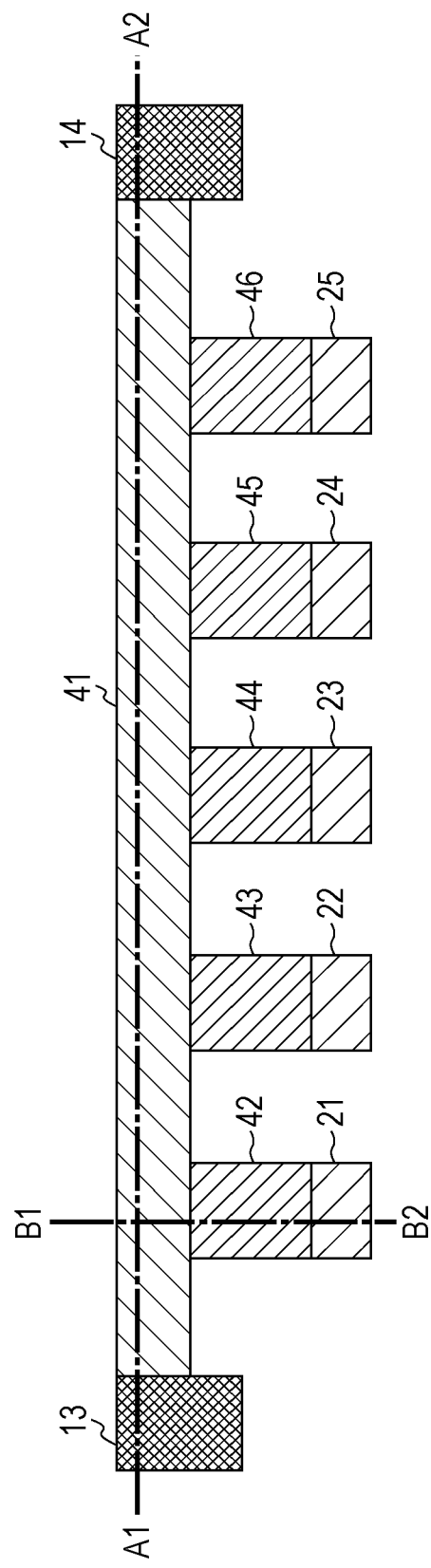
FIG. 4 is a schematic view of charge transfer channels formed in the photodetection device according to the first embodiment.

FIG. 4 is a schematic view schematically depicting charge transfer channels formed in a case where a first predetermined potential is applied to the first gate electrode 11 and a second predetermined potential is applied to the second gate electrode 16 to the sixth gate electrode 20. Here, the first predetermined potential is a potential for forming an inversion layer on the surface of the injection region 15 positioned below the first gate electrode 11. Furthermore, the second predetermined potential is a potential for forming inversion layers on the surfaces of the injection region 15 positioned below the second gate electrode 16 to the sixth gate electrode 20. Here, a description will be given assuming that a common second predetermined potential is applied to the second gate electrode 16 to the sixth gate electrode 20 in order to form inversion layers on the surfaces of the injection region 15 positioned below the second gate electrode 16 to the sixth gate electrode 20. However, the present disclosure is not necessarily restricted to an example in which a common second predetermined potential is applied to the second gate electrode 16 to the sixth gate electrode 20, as long as inversion layers can be formed on the surfaces of the injection region 15 positioned below the second gate electrode 16 to the sixth gate electrode 20. For example, an example in which mutually different predetermined potentials are applied to the respective gate electrodes is also possible.

As depicted in FIG. 4, the charge transfer channels formed on the surface of the injection region 15 are configured from a first charge transfer channel 41, a second charge transfer channel 42, a third charge transfer channel 43, a fourth charge transfer channel 44, a fifth charge transfer channel 45, and a sixth charge transfer channel 46. Furthermore, as depicted in the same drawing, the sixth charge transfer channel 46 diverges from the first charge transfer channel 41 at a position that is further than the fifth charge transfer channel 45 from the photoelectric conversion unit 13. The fifth charge transfer channel 45 diverges from the first charge transfer channel 41 at a position that is further than the fourth charge transfer channel 44 from the photoelectric conversion unit 13. The fourth charge transfer channel 44 diverges from the first charge transfer channel 41 at a position that is further than the third charge transfer channel 43 from the photoelectric conversion unit 13. The third charge transfer channel 43 diverges from the first charge transfer channel 41 at a position that is further than the second charge transfer channel 42 from the photoelectric conversion unit 13.

The first charge transfer channel 41 transfers charge generated by the photoelectric conversion unit 13 to the charge sweeping unit 14 when the potential of the charge sweeping unit 14 is set to a predetermined potential that is lower than the potential of the photoelectric conversion unit 13.

Figure 5:
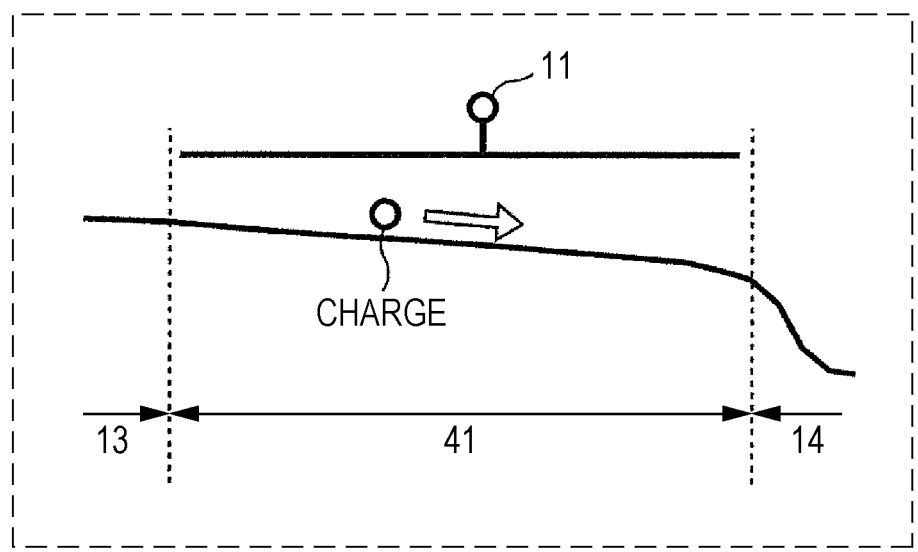
FIG. 5 is a schematic view depicting the way in which a first charge transfer channel transfers charge.

FIG. 5 is a schematic view depicting the way in which the first charge transfer channel 41 transfers charge, in a cross section along line A1-A2 depicted in FIG. 4. The solid line indicates the potential in the cross section along line A1-A2 depicted in FIG. 4.

As depicted in the same drawing, when the potential of the charge sweeping unit 14 is set to a predetermined potential that is lower than the potential of the photoelectric conversion unit 13, the potential within the first charge transfer channel 41 slants from the photoelectric conversion unit 13 side toward the charge sweeping unit 14 side. Thus, the first charge transfer channel 41 transfers the charge generated by the photoelectric conversion unit 13 to the charge sweeping unit 14.

Figure 6:
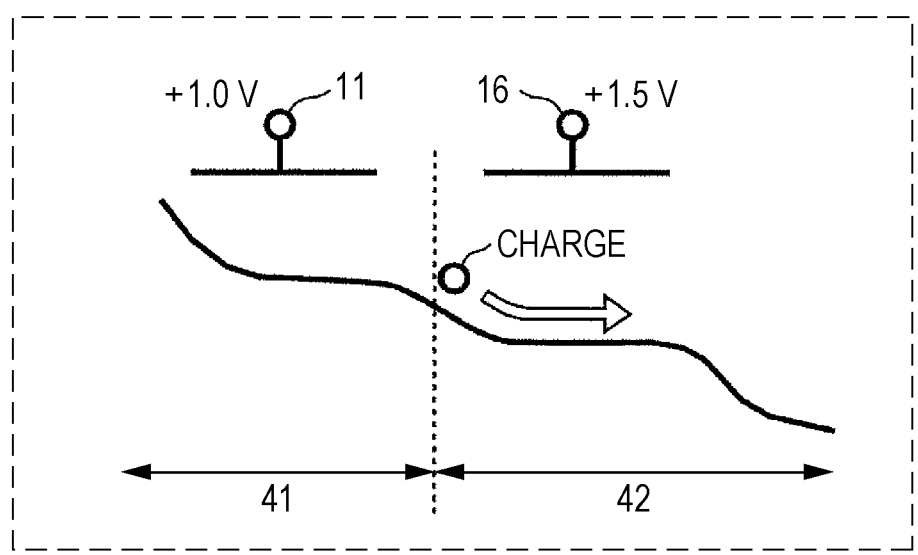
FIG. 6 is a schematic view depicting the way in which a second charge transfer channel is formed.
Figure 7:
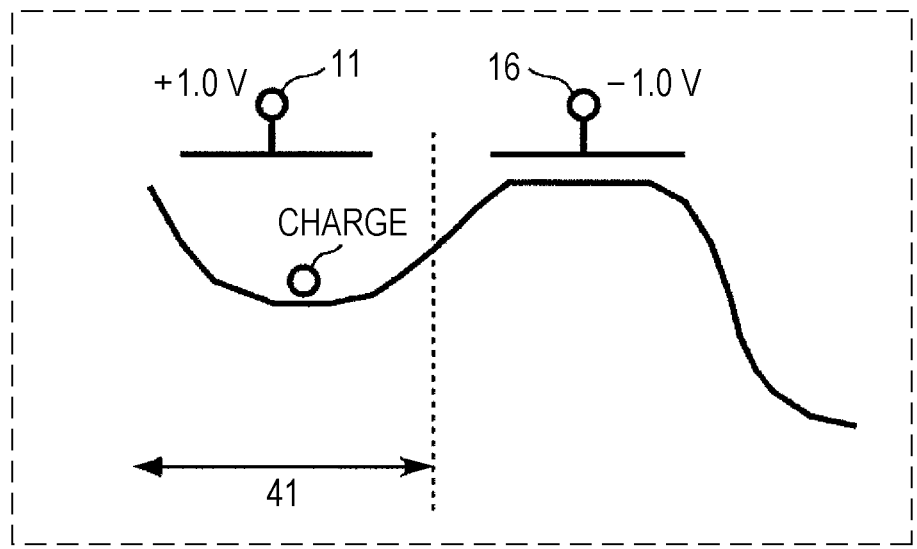
FIG. 7 is a schematic view depicting the way in which the second charge transfer channel is not formed.

FIG. 6 is a schematic view depicting the way in which the second charge transfer channel 42 is formed when the TG1 is on, in a cross section along line B1-B2 depicted in FIG. 4. The solid line indicates the potential when the transistor TG1 is on, in the cross section along line B1-B2 depicted in FIG. 4. In FIG. 6 and FIG. 7 described later, the TG1 turns on when 1.5 V is applied to the second gate electrode 16, and the TG1 turns off when −1.0 V is applied. However, the potential that is applied to switch the TG1 on is not necessarily restricted to the example of 1.5 V, and the potential that is applied to switch the TG1 off is not necessarily restricted to the example of −1.0 V.

As depicted in FIG. 6, in a state in which the TG1 is on, the potential of the first charge accumulation unit 21 is set to a predetermined potential that is lower than the potential of a diverging point to the second charge transfer channel 42 in the first charge transfer channel 41, the potential in the second charge transfer channel 42 thereby slants from the first charge transfer channel 41 side toward the first charge accumulation unit 21 side as depicted in FIG. 6. Therefore, the second charge transfer channel 42 transfers a portion of charge of the charge group being transferred in the first charge transfer channel 41, to the first charge accumulation unit 21.

FIG. 7 is a schematic view depicting the way in which the second charge transfer channel 42 is not formed when the TG1 is off, in a cross section along line B1-B2 depicted in FIG. 4. The solid line indicates the potential when the transistor TG1 is off, in the cross section along line B1-B2 depicted in FIG. 4.

The second charge transfer channel 42 is not formed in a case where the TG1 is off. In this case, the potential between the diverging point to the second charge transfer channel 42 in the first charge transfer channel 41 and the first charge accumulation unit 21 becomes as depicted in FIG. 7. Therefore, in this case, the charge traveling in the first charge transfer channel 41 is not transferred to the first charge accumulation unit 21.

Similarly, in a state in which the TG2 to the TG5 are on, the potentials of the second charge accumulation unit 22 to the fifth charge accumulation unit 25 are set to predetermined potentials that are lower than the potentials of the diverging points to the third charge transfer channel 43 to the sixth charge transfer channel 46 in the first charge transfer channel 41, the third charge transfer channel 43 to the sixth charge transfer channel 46 thereby transfers a portion of charge of the charge group being transferred in the first charge transfer channel 41, to the second charge accumulation unit 22 to the fifth charge accumulation unit 25, respectively.

However, as previously mentioned (see FIG. 5), the potentials at the diverging points to each of the other charge transfer channels in the first charge transfer channel 41 sequentially decrease from the side of the diverging point to the second charge transfer channel 42 to the side of the diverging point to the sixth charge transfer channel 46. Thus, the difference in potential between the source/drain in the TG1 to TG5 declines sequentially from the TG1 to TG5. Consequently, the current driving capability declines sequentially from the TG1 to TG5.

Figure 8:
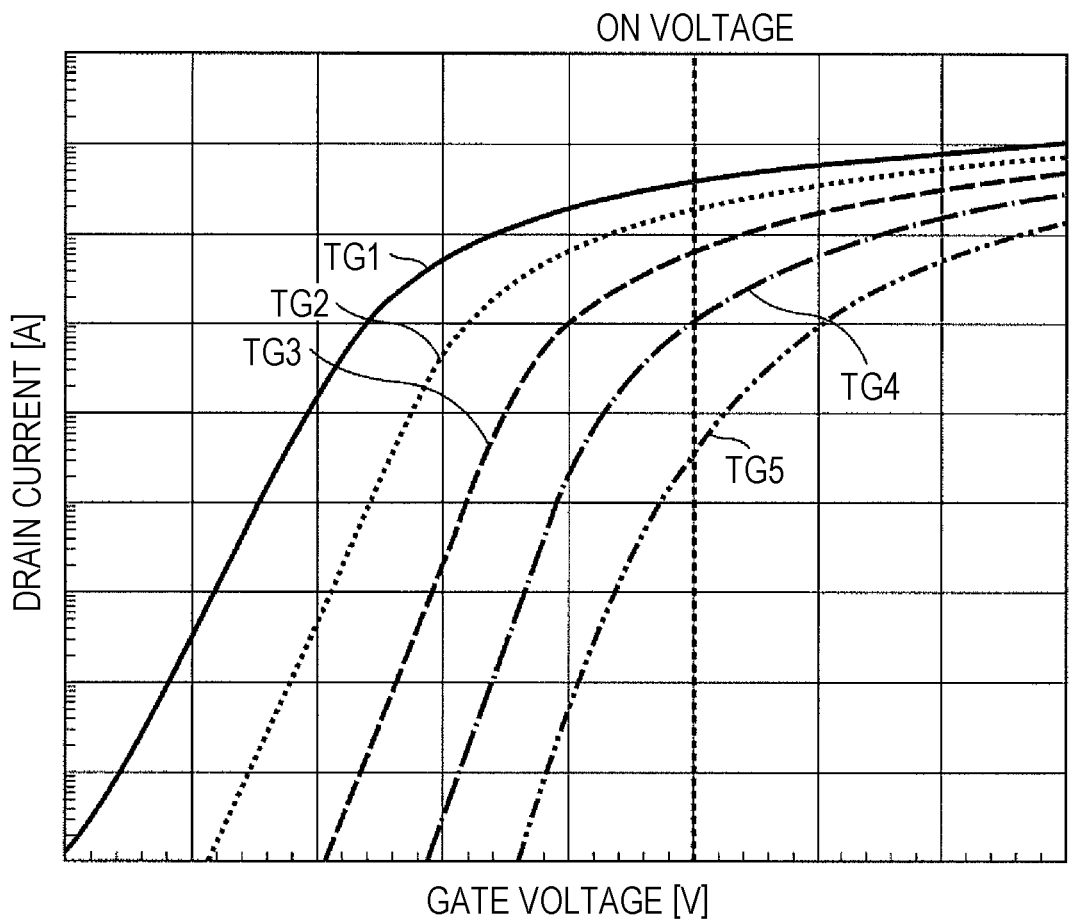
FIG. 8 is a characteristics diagram depicting current-voltage characteristics for each transistor.

FIG. 8 depicts, with regard to each of the TG1 to TG5, a characteristics diagram showing current-voltage characteristics for each transistor TG1 to TG5 in a case where the first charge transfer channel 41 side is taken as the source and the first charge accumulation unit 21 to the fifth charge accumulation unit 25 side is taken as the drain.

Figure 9A:
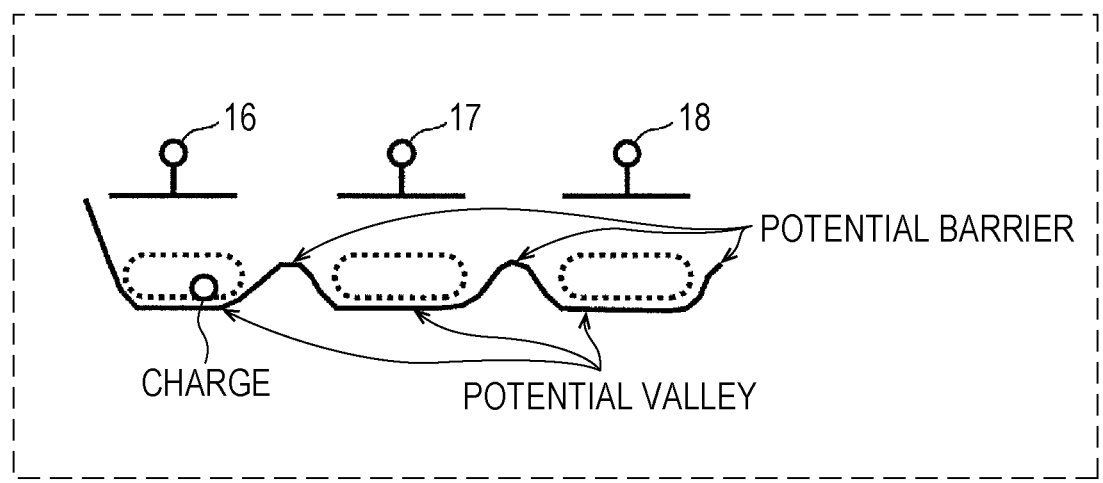
FIG. 9A is a schematic view depicting a potential along line X3-X4 of the photodetection device according to the first embodiment.
Figure 9B:
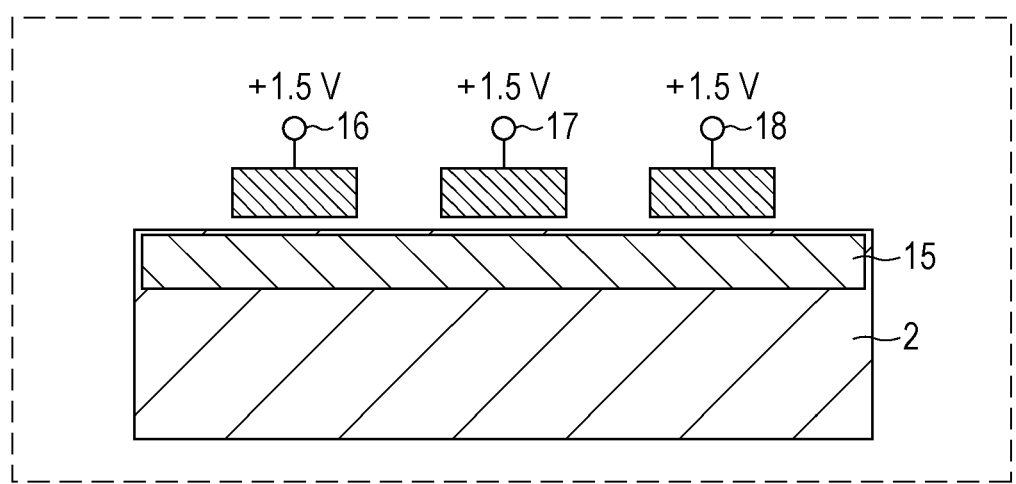
FIG. 9B is a cross-sectional view along line X3-X4 of the photodetection device according to the first embodiment.

FIG. 9A is a schematic view depicting the potential in a state in which the TG1 to TG3 are on, in a cross section along line X3-X4 depicted in FIG. 1, of the photodetection device 10. Also, FIG. 9B is a cross-sectional view along line X3-X4 depicted in FIG. 1, of the photodetection device 10.

As depicted in FIG. 9A, when the TG1 to TG3 turn on, potential valleys are formed in regions directly below the TG1, TG2, and TG3 in the main section 30. Also, potential barriers are formed between the potential valleys. Therefore, when charge is captured in any of the potential valleys, it becomes difficult for that charge to pass over a potential barrier and move to another potential valley.

The description of the photodetection device 10 will be continued returning to FIGS. 1 to 3 once again.

The first charge accumulation unit 21 accumulates charge transferred via the first finger section 31 (also referred to as a second diffusion region). The second charge accumulation unit 22 accumulates charge transferred via the second finger section 32 (also referred to as a third diffusion region). The third charge accumulation unit 23 accumulates charge transferred via the third finger section 33 (also referred to as a fourth diffusion region). The fourth charge accumulation unit 24 accumulates charge transferred via the fourth finger section 34 (also referred to as a fifth diffusion region). The fifth charge accumulation unit 25 accumulates charge transferred via the fifth finger section 35 (also referred to as a sixth diffusion region).

As depicted in FIG. 1, the first charge accumulation unit 21 to the fifth charge accumulation unit 25 are respectively connected to read circuits 70a to 70e, which read amounts of accumulated charge, via source follower transistors 60a to 60e.

The first gate electrode 11, the second gate electrode 16, the third gate electrode 17, the fourth gate electrode 18, the fifth gate electrode 19, and the sixth gate electrode 20 are formed from polysilicon to which electrical conductivity has been imparted by being injected with an impurity, for example.

The first gate electrode 11 can switch between whether or not an inversion layer is formed on the surface of the injection region 15 positioned below the first gate electrode 11, by switching an applied voltage.

In other words, the first gate electrode 11 switches between transfer and cutoff of charge in the first charge transfer channel 41, by switching the applied voltage.

Similarly, the second gate electrode 16 to the sixth gate electrode 20 can each switch between whether or not inversion layers are formed on the surfaces of the injection region 15 positioned below the second gate electrode 16 to the sixth gate electrode 20 by switching an applied voltage.

In other words, the second gate electrode 16 to the sixth gate electrode 20 respectively switch between transfer and cutoff of charge in the second charge transfer channel 42 to the sixth charge transfer channel 46, by switching the applied voltages.

Next, an imaging device according to the first embodiment, which includes the aforementioned photodetection device 10, will be described.

Figure 10:
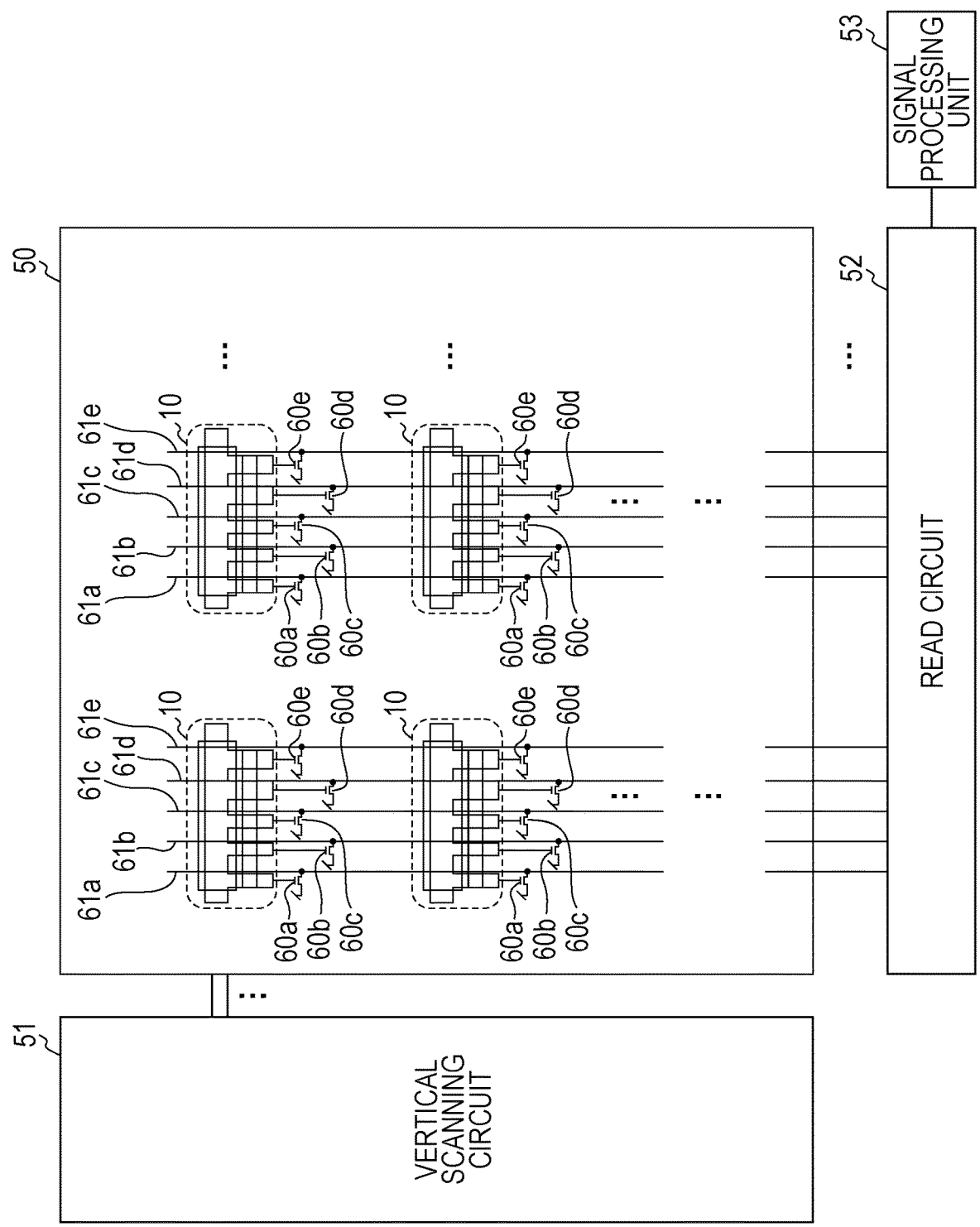
FIG. 10 is a block diagram depicting the configuration of an imaging device according to the first embodiment.

FIG. 10 is a block diagram depicting the configuration of an imaging device 1 according to the first embodiment.

As depicted in the same drawing, the imaging device 1 is provided with a pixel array 50, a vertical scanning circuit 51, a read circuit 52, and a signal processing unit 53.

The pixel array 50 is configured with a plurality of pixels configured from photodetection devices 10 being arranged in an array (also referred to as a matrix form, for example).

In each photodetection device 10, the first charge accumulation unit 21 to the fifth charge accumulation unit 25 are connected to the read circuit 52 via the source follower transistors 60a to 60e and read lines 61a to 61e, respectively. In other words, the read circuits 70a to 70e in FIG. 1 each correspond to the read circuit 52 in FIG. 10. Here, the read lines 61a to 61e constitute common signal lines in column units.

Furthermore, each photodetection device 10 is connected to the vertical scanning circuit 51 via a plurality of common control signal lines (not depicted) in row units.

The vertical scanning circuit 51 controls the operation of each photodetection device 10 in row units, via the plurality of common control signal lines (not depicted) in row units, with respect to the pixel array 50.

The vertical scanning circuit 51 repeatedly carries out control of the photodetection devices 10 according to row units in predetermined periods, sequentially from the row at the uppermost side to the row at the lowermost side of the pixel array 50.

The read circuit 52 operates in synchronization with the vertical scanning circuit 51. The read circuit 52 reads, from the pixel array 50, in the row units, signals corresponding to the amounts of charge accumulated in the first charge accumulation unit 21 to the fifth charge accumulation unit 25 in each photodetection device 10 positioned in the row in question. The signals that have been read are then output to the signal processing unit 53.

The signal processing unit 53 carries out various types of signal processing with respect to the signals that have been output from the read circuit 52. As an example, the signal processing unit 53 may be configured including a processor and a memory and realized by the processor executing a program stored in the memory, or may be realized by means of dedicated hardware.

[1-2. Examination]

Hereinafter, the photodetection device 10 will be examined.

When the TG1 to TG5 change from an off state to an on state, potential valleys are formed in regions directly below the TG1 to TG5 in the main section 30, in other words, regions in the vicinity of the first charge transfer channel 41, as depicted in FIG. 9A. Portions of charge of a charge group traveling in the first charge transfer channel 41 (particularly charge traveling in the vicinity of the potential valleys to be newly formed) in a state in which the TG1 to TG5 are off are therefore captured comparatively easily in the regions of the potential valleys that are newly formed in the vicinity of the TG1 to TG5 when the TG1 to TG5 are switched on.

As previously mentioned, since potential barriers are formed between the potential valleys, it becomes difficult for charge that has been captured in any of the potential valleys to pass over a potential barrier and move to another potential valley. Furthermore, the potentials of the potential valleys are lower than the potentials at the corresponding diverging points to the second charge transfer channel 42 to the sixth charge transfer channel 46 in the first charge transfer channel 41. It therefore becomes difficult for charge that has been captured in any of the potential valleys to move toward the charge sweeping unit 14. Therefore, when charge is temporarily captured in a potential valley, it becomes difficult for that charge to move to a region other than the first charge accumulation unit 21 to the fifth charge accumulation unit 25 corresponding to that potential valley. Thus, the transistors (here, the TG1 to TG5) forming the potential valleys can cause the majority of the charge captured in those potential valleys to be moved to the corresponding charge accumulation units even if the current driving capabilities of the transistors are comparatively low, for example. Therefore, the photodetection device 10 is able to read an amount of charge more accurately from a charge group traveling in a position that is comparatively far from the photoelectric conversion unit 13 (here, a region in the vicinity of the TG5 where the current driving capability thereof becomes less than that of the other transistors, for example) in the first charge transfer channel 41.

Consequently, according to the photodetection device 10, it is possible to improve temporal resolution in the detection of a timing at which light is incident.

Second Embodiment

Here, an imaging device according to the second embodiment in which a portion of the configuration has been altered from that of the imaging device 1 according to the first embodiment will be described.

A photodetection device constituting the imaging device according to the second embodiment has a configuration in which the first gate electrode has a shape provided with: an extended section that extends between the second gate electrode and the third gate electrode; an extended section that extends between the third gate electrode and the fourth gate electrode; an extended section that extends between the fourth gate electrode and the fifth gate electrode; and an extended section that extends between the fifth gate electrode and the sixth gate electrode.

[2-1. Configuration]

Hereinafter, an imaging device according to the second embodiment will be described with reference to the drawings, focusing on the differences with the imaging device 1 according to the first embodiment.

In the imaging device according to the second embodiment, the photodetection device 10 has been altered to a photodetection device 10a according to the second embodiment from the imaging device 1 according to the first embodiment.

Figure 11:
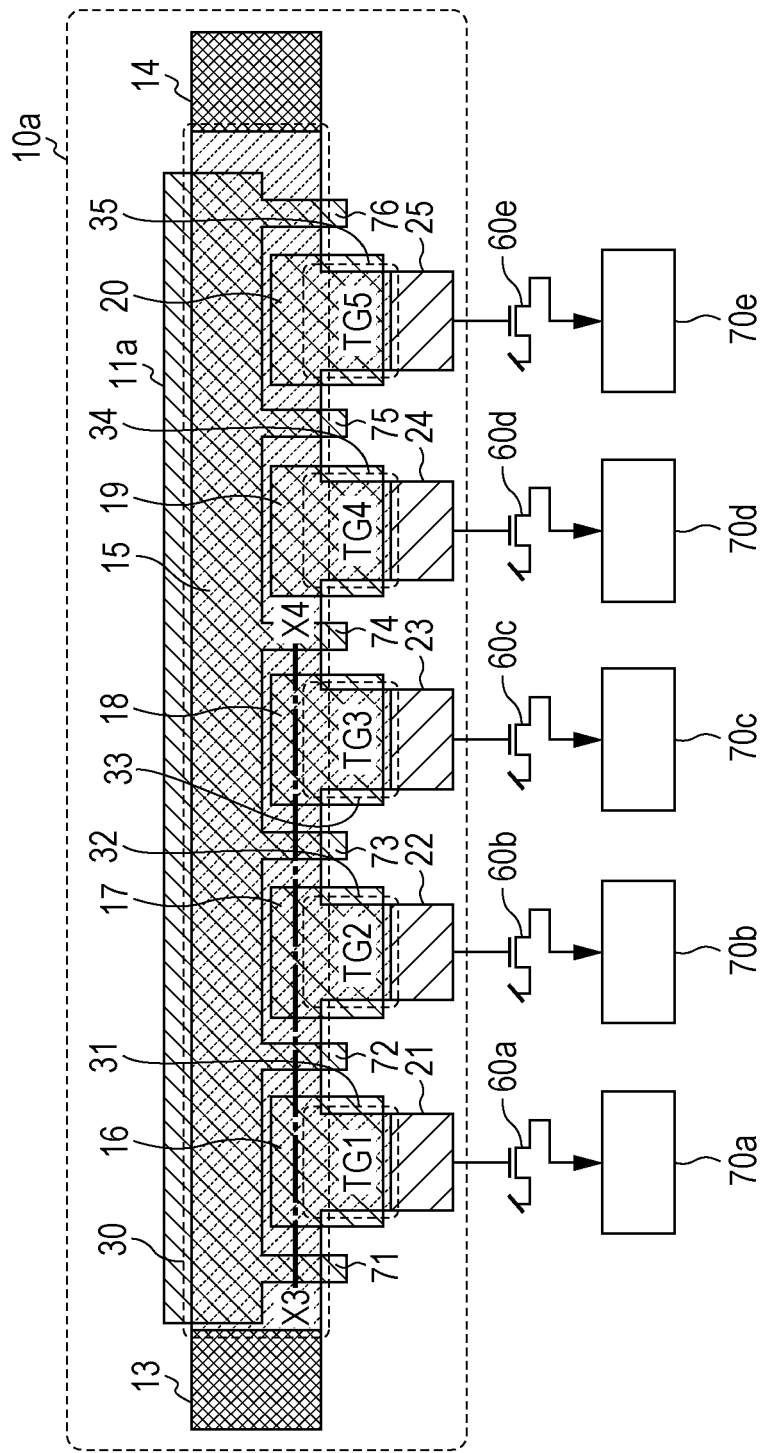
FIG. 11 is a plan view of a photodetection device according to a second embodiment.

FIG. 11 is a plan view of a photodetection device 10a according to the second embodiment.

As depicted in the same drawing, from the photodetection device 10 according to the first embodiment, the first gate electrode 11 has been altered to a first gate electrode 11a in the photodetection device 10a.

Also, the first gate electrode 11a has been altered in such a way that a first extended section 71, a second extended section 72, a third extended section 73, a fourth extended section 74, a fifth extended section 75, and a sixth extended section 76 have been added to the first gate electrode 11 according to the first embodiment.

As depicted in FIG. 11, the second extended section 72 extends between the second gate electrode 16 and the third gate electrode 17. Furthermore, the third extended section 73 extends between the third gate electrode 17 and the fourth gate electrode 18. Furthermore, the fourth extended section 74 extends between the fourth gate electrode 18 and the fifth gate electrode 19. Furthermore, the fifth extended section 75 extends between the fifth gate electrode 19 and the sixth gate electrode 20. Also, the first extended section 71 extends along a side surface at the photoelectric conversion unit 13 side of the second gate electrode 16, and the sixth extended section 76 extends along a side surface at the charge sweeping unit 14 side of the sixth gate electrode 20.

Figure 12A:
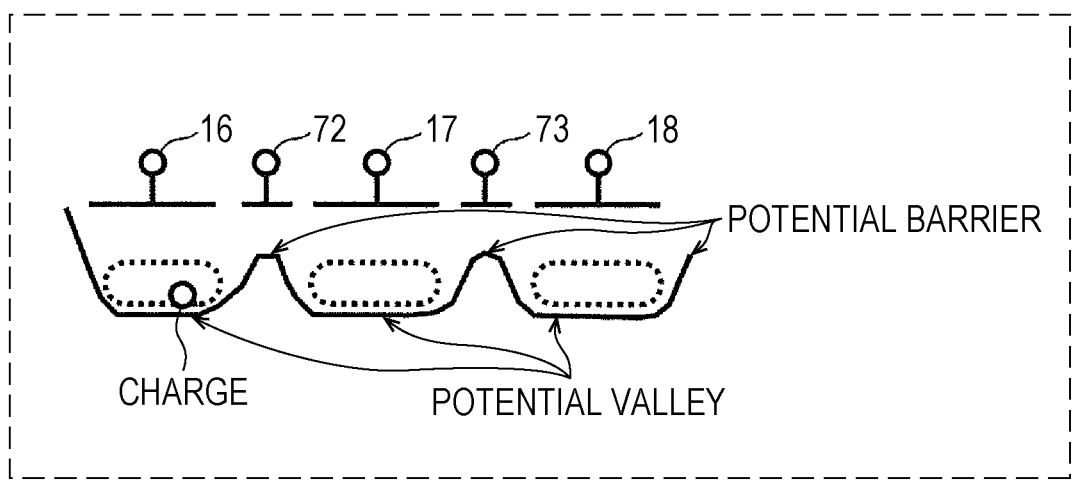
FIG. 12A is a schematic view depicting a potential along line X3-X4 of the photodetection device according to the second embodiment.
Figure 12B:
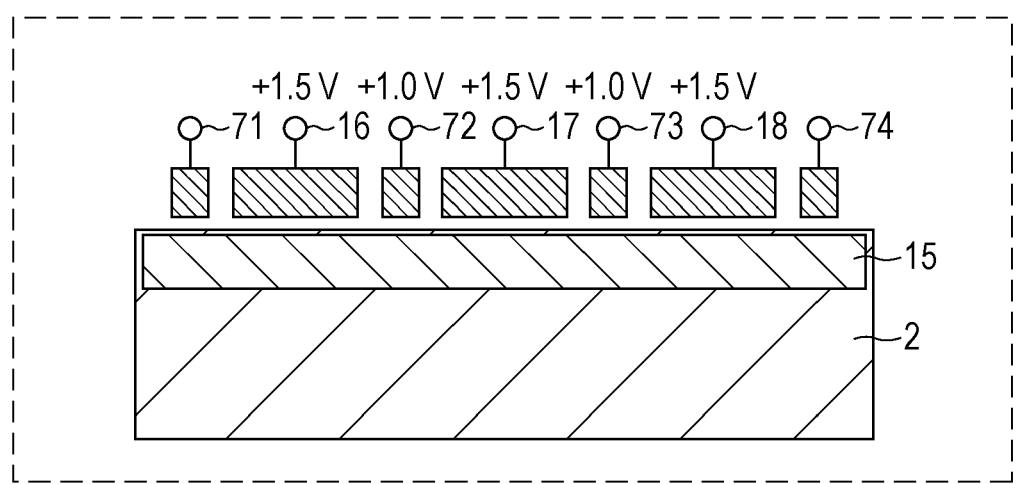
FIG. 12B is a cross-sectional view along line X3-X4 of the photodetection device according to the second embodiment.

FIG. 12A is a schematic view depicting the potential in a state in which the TG1 to TG3 are on, along line X3-X4 depicted in FIG. 11, of the photodetection device 10a. Also, FIG. 12B is a cross-sectional view along line X3-X4 depicted in FIG. 11, of the photodetection device 10a.

As depicted in FIG. 12A, when the TG1 to TG3 switch on, similar to the case of the first embodiment, potential valleys are formed in regions directly below the TG1, TG2, and TG3 in the main section 30. Also, potential barriers are formed between the potential valleys.

As mentioned above, in the first gate electrode 11a, the first extended section 71 to the sixth extended section 76 have been added to the first gate electrode 11 according to the first embodiment. Therefore, the potentials of the potential barriers in the second embodiment are more securely fixed than the potentials of the potential barriers in the first embodiment due to the first extended section 71 to the sixth extended section 76.

[2-2. Examination]

Hereinafter, the photodetection device 10a will be examined.

As mentioned above, the potentials of the potential barriers in the second embodiment are more securely fixed than the potentials of the potential barriers in the first embodiment. Therefore, the charge that is captured in the potential valleys is more securely captured by those potential valleys. The photodetection device 10a can thereby read an amount of charge more accurately from a charge group that is traveling in the first charge transfer channel 41 than the photodetection device 10 according to the first embodiment.

Consequently, according to the photodetection device 10a, it is possible to further improve temporal resolution in the detection of a timing at which light is incident, compared to the photodetection device 10 according to the first embodiment.

Third Embodiment

Here, an imaging device according to the third embodiment in which a portion of the configuration has been altered from that of the imaging device according to the second embodiment will be described.

In the third embodiment, a photodetection device constituting the imaging device according to the third embodiment is configured being altered with respect to the photodetection device 10a constituting the imaging device according to the second embodiment, in such a way that an impurity of a conduction type that is different from the conduction type of the impurity injected into the injection region 15 is injected into regions below the first extended section 71 to the sixth extended section 76.

[3-1. Configuration]

Hereinafter, the imaging device according to the third embodiment will be described with reference to the drawings, focusing on the differences with the imaging device according to the second embodiment.

In the imaging device according to the third embodiment, the photodetection device 10 has been altered to a photodetection device 10b according to the third embodiment from the imaging device according to the second embodiment.

Figure 13:
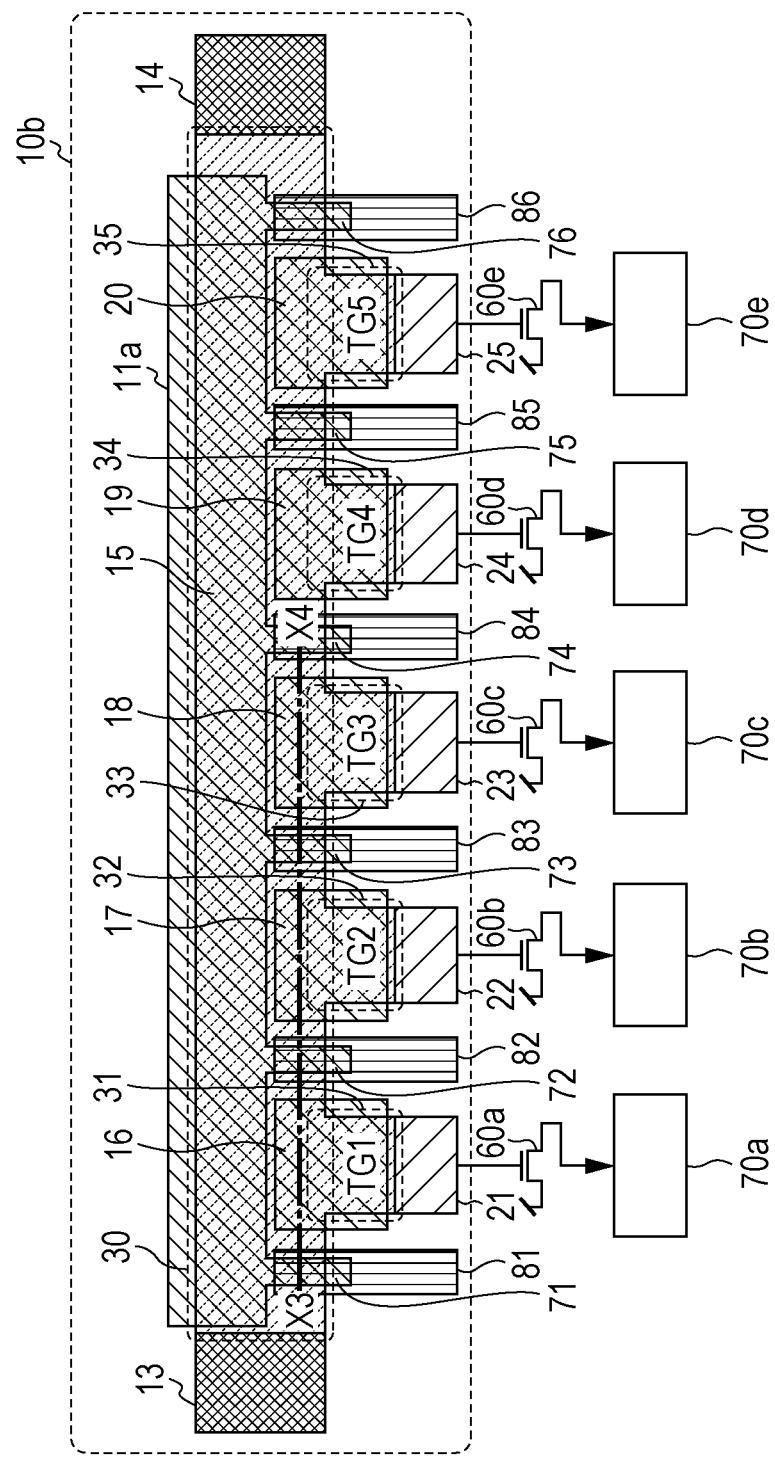
FIG. 13 is a plan view of a photodetection device according to a third embodiment.

FIG. 13 is a plan view of the photo detection device 10b according to the third embodiment.

As depicted in the same drawing, the photo detection device 10b has been altered from the photodetection device 10a according to the second embodiment in such a way that a first inversion injection region 81, a second inversion injection region 82, a third inversion injection region 83, a fourth inversion injection region 84, a fifth inversion injection region 85, and a sixth inversion injection region 86 have been added.

Here, the first inversion injection region 81 to the sixth inversion injection region 86 are each a region into which an impurity of a conduction type (here, a p-type conduction type) that is different from the conduction type of the impurity injected into the injection region 15 (here, an n-type conduction type) is injected.

As depicted in FIG. 13, the first inversion injection region 81 to the sixth inversion injection region 86 are each arranged including a region below the first extended section 71 to the sixth extended section 76.

Figure 14A:
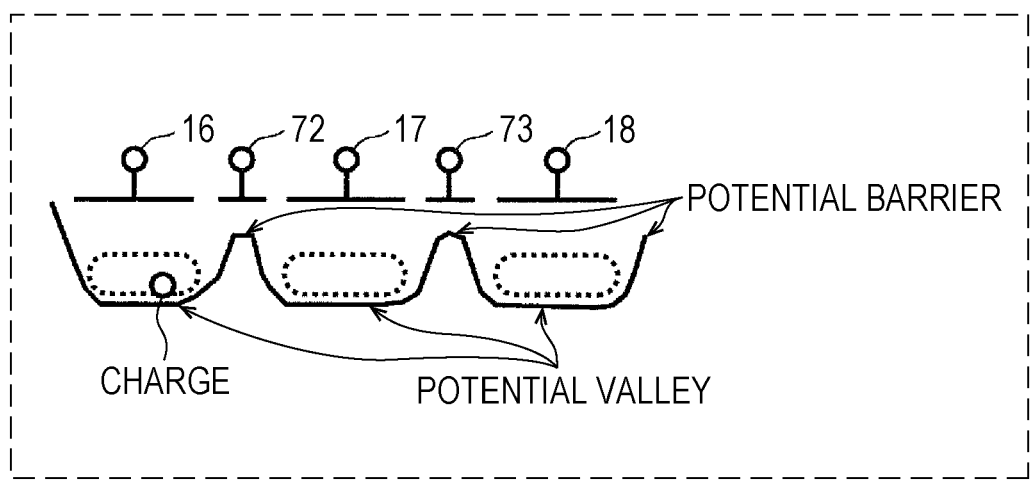
FIG. 14A is a schematic view depicting a potential along line X3-X4 of the photodetection device according to the third embodiment.
Figure 14B:
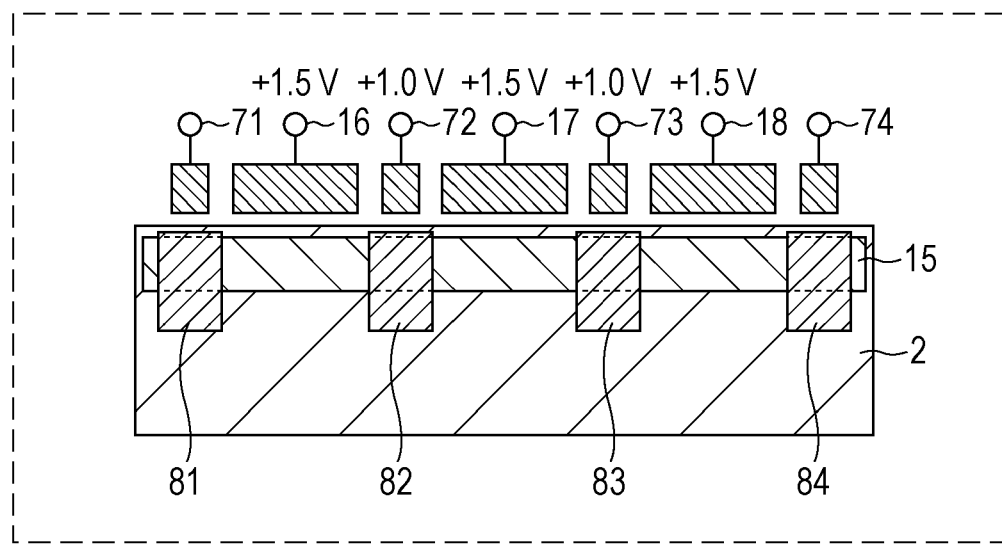
FIG. 14B is a cross-sectional view along line X3-X4 of the photodetection device according to the third embodiment.

FIG. 14A is a schematic view depicting the potential in a state in which the TG1 to TG3 are on, along line X3-X4 depicted in FIG. 13, of the photodetection device 10b. Also, FIG. 14B is a cross-sectional view along line X3-X4 depicted in FIG. 13, of the photodetection device 10b.

As depicted in FIG. 14A, when the TG1 to TG3 switch on, similar to the case of the second embodiment, potential valleys are formed in regions directly below the TG1, TG2, and TG3 in the main section 30. Also, potential barriers are formed between the potential valleys.

As mentioned above, an impurity of a conduction type (here, a p-type conduction type) that is different from the conduction type of the impurity injected into the injection region 15 (here, an n-type conduction type) is injected into the regions below the first extended section 71 to the sixth extended section 76. Therefore, the potentials of the potential barriers in the third embodiment are fixed at higher potentials than the potentials of the potential barriers in the second embodiment.

[3-2. Examination]

Hereinafter, the photo detection device 10b will be examined.

As mentioned above, the potentials of the potential barriers in the third embodiment are fixed at higher potentials than the potentials of the potential barriers in the second embodiment. Therefore, the charge that is captured in the potential valleys is more securely captured by those potential valleys. The photodetection device 10b can thereby read an amount of charge more accurately from a charge group that is traveling through the first charge transfer channel 41 than the photodetection device 10a according to the second embodiment.

Consequently, according to the photodetection device 10b, it is possible to further improve temporal resolution in the detection of a timing at which light is incident, compared to the photodetection device 10a according to the second embodiment.

(Supplement)

Embodiments 1 to 3 have been described as mentioned above as exemplifications of the technique disclosed in the present application. However, the technique according to the present disclosure is not restricted thereto and can also be applied to an embodiment in which an alteration, substitution, addition, omission, or the like has been implemented as appropriate provided it does not depart from the gist of the present disclosure.

Hereinafter, examples of modified examples in the present disclosure will be listed.

(1) In the first embodiment, the photodetection device 10 was described as being provided with five charge accumulation units. However, the number of charge accumulation units provided in the photodetection device 10 is not necessarily restricted to the example of five as long as there is one or more.

(2) In the first embodiment, when describing the photodetection device 10 using FIG. 1 and the like, a description was given with the widths of the first finger section 31 to the fifth finger section 35 being depicted as though equal, the widths of the first charge accumulation unit 21 to the fifth charge accumulation unit 25 being depicted as though equal, and the widths of the second gate electrode 16 to the sixth gate electrode 20 being depicted as though equal. However, the photodetection device 10 is not restricted to the configuration example in which the widths of the first finger section 31 to the fifth finger section 35 are equal, is not restricted to the configuration example in which the widths of the first charge accumulation unit 21 to the fifth charge accumulation unit 25 are equal, and is not restricted to the configuration example in which the widths of the second gate electrode 16 to the sixth gate electrode 20 are equal. For example, the photodetection device 10 may have a configuration in which at least one of the widths of the first finger section 31 to the fifth finger section 35 is different from the other widths, at least one of the widths of the first charge accumulation unit 21 to the fifth charge accumulation unit 25 is different from the other widths, and at least one of the widths of the second gate electrode 16 to the sixth gate electrode 20 is different from the other widths.

(3) In the photodetection device 10b of the third embodiment, semiconductor substrate 2 is of a p-type conduction type, the impurity injected into the injection region 15 is of an n-type conduction type, and the impurity injected into the first inversion injection region 81 to the sixth inversion injection region 86 is of a p-type conduction type. However, the photodetection device 10b is not necessarily restricted to the aforementioned configuration example. For example, for the photodetection device 10b, a configuration example is also possible in which the semiconductor substrate 2 is of an n-type conduction type, the impurity injected into the injection region 15 is of a p-type conduction type, and the impurity injected into the first inversion injection region 81 to the sixth inversion injection region 86 is of an n-type conduction type.

(4) In the first embodiment, a photodiode was given as an example of a photoelectric conversion element. However, it is not always necessary for the photoelectric conversion element to be restricted to a photodiode as long as it is able to receive incident light and generate charge. As an example, the photoelectric conversion element may be an element configured with photoelectric conversion films being layered.

The photodetection device and imaging device according to the present disclosure can be widely used for devices which detect light that has been input.

What is claimed is:

1. A photodetection device, comprising:
a photoelectric converter that generates charge;
a first diffusion region that has a first end and a second end, the first end being connected to the photoelectric converter, the first diffusion region extending in a first direction from the first end toward the second end;
a second diffusion region that has a third end and a fourth end, the third end being connected to a first side surface of the first diffusion region, the first side surface being along the first direction, the second diffusion region extending in a second direction from the third end toward the fourth end;
a first charge accumulator that is connected to the fourth end of the second diffusion region;
a first gate electrode that covers at least a part of the first diffusion region; and
a second gate electrode that covers at least a part of the second diffusion region, wherein
the second gate electrode covers a first portion of the first diffusion region without the first gate electrode intervention, the first portion being adjacent to the second diffusion region.

2. The photodetection device according to claim 1, further comprising:
a first voltage supply circuit that is connected to the first gate electrode; and
a second voltage supply circuit that is connected to the second gate electrode, wherein
a first charge transfer channel through which charge from the photoelectric converter is transferred in the first direction is formed in the first diffusion region when the first voltage supply circuit supplies a first voltage to the first gate electrode, and
a second charge transfer channel through which a part of charge transferred in the first charge transfer channel is transferred in the second direction is formed in the second diffusion region and the first portion of the first diffusion region when the second voltage supply circuit supplies a second voltage to the second gate electrode.

3. The photodetection device according to claim 1, further comprising:
a third diffusion region that has a fifth end and a sixth end, the fifth end being connected to the first side surface of the first diffusion region, the third diffusion region extending in a third direction from the fifth end toward the sixth end;
a second charge accumulator that is connected to the sixth end of the third diffusion region; and
a third gate electrode that covers at least a part of the third diffusion region, wherein the third gate electrode covers a second portion of the first diffusion region without the first gate electrode intervention, the second portion being adjacent to the third diffusion region, and the first gate electrode covers a third portion of the first diffusion region without the second and third gate electrodes intervention, the third portion being located between the first portion and the second portion.

4. The photodetection device according to claim 3, wherein the first diffusion region, the second diffusion region, and the third diffusion region include an impurity of a first conduction type, and the third portion of the first diffusion region includes an impurity of a second conduction type that is different from the first conduction type.

5. The photodetection device according to claim 3, further comprising:

a first voltage supply circuit that is connected to the first gate electrode;

a second voltage supply circuit that is connected to the second gate electrode; and a third voltage supply circuit that is connected to the third gate electrode, wherein a first charge transfer channel through which charge from the photoelectric converter is transferred in the first direction is formed in the first diffusion region when the first voltage supply circuit supplies a first voltage to the first gate electrode, a second charge transfer channel through which a part of charge transferred in the first charge transfer channel is transferred in the second direction is formed in the second diffusion region and the first portion of the first diffusion region when the second voltage supply circuit supplies a second voltage to the second gate electrode, and a third charge transfer channel through which a part of the charge transferred in the first charge transfer channel is transferred in the third direction is formed in the third diffusion region and the second portion of the first diffusion region when the third voltage supply circuit supplies a third voltage to the third gate electrode.

6. The photodetection device according to claim 5, wherein the third voltage supply circuit supplies the third voltage to the third gate electrode concurrently with the second voltage supply circuit supplying the second voltage to the second gate electrode.

7. The photodetection device according to claim 5, wherein the second gate electrode and the third gate electrode are a single electrode, and the second voltage supply circuit and the third voltage supply circuit are a single voltage supply circuit.

8. The photodetection device according to claim 3, wherein the first diffusion region, the second diffusion region and the third diffusion region are a single diffusion region located on a surface of a semiconductor substrate.

9. The photodetection device according to claim 1, further comprising a charge sweeper that is connected to the second end of the first diffusion region.

10. The photodetection device according to claim 1, wherein the first diffusion region and the second diffusion region are located on a surface of a semiconductor substrate, and the first side surface has a linear shape in plan view.

11. The photodetection device according to claim 1, wherein the first diffusion region and the second diffusion region are a single diffusion region located on a surface of a semiconductor substrate.

12. An imaging device, comprising a pixel array in which a plurality of pixels configured from the photodetection device according to claim 1 are arranged in an array.

* * * * *